US010156617B2

(12) United States Patent
Bekku

(10) Patent No.: US 10,156,617 B2
(45) Date of Patent: Dec. 18, 2018

(54) MAGNETIC RESONANCE SIGNAL PROCESSING METHOD, MAGNETIC RESONANCE SIGNAL PROCESSING APPARATUS AND MAGNETIC RESONANCE APPARATUS, AND PROGRAM

(71) Applicant: General Electric Company, Schenectady, NY (US)

(72) Inventor: Mitsuhiro Bekku, Hino (JP)

(73) Assignee: GENERAL ELECTRIC COMPANY, Schenectady, NY (US)

(*) Notice: Subject to any disclaimer, the term of this patent is extended or adjusted under 35 U.S.C. 154(b) by 166 days.

(21) Appl. No.: 15/321,332

(22) PCT Filed: Jun. 30, 2015

(86) PCT No.: PCT/US2015/038465
§ 371 (c)(1),
(2) Date: Dec. 22, 2016

(87) PCT Pub. No.: WO2016/003991
PCT Pub. Date: Jan. 7, 2016

(65) Prior Publication Data
US 2017/0139021 A1 May 18, 2017

(30) Foreign Application Priority Data

Jun. 30, 2014 (JP) ................................. 2014-133687

(51) Int. Cl.
*G01R 33/34* (2006.01)
*G01R 33/24* (2006.01)
(Continued)

(52) U.S. Cl.
CPC ....... *G01R 33/3657* (2013.01); *G01R 33/246* (2013.01); *G01R 33/341* (2013.01); *G01R 33/5659* (2013.01); *G01R 33/583* (2013.01)

(58) Field of Classification Search
CPC .............. G03G 33/3657; G03G 33/246; G03G 33/5659; G03G 33/583; G03G 33/341
See application file for complete search history.

(56) References Cited

U.S. PATENT DOCUMENTS 5,208,534 A * 5/1993 Okamoto ........... G01R 33/3415
324/307
2002/0156362 A1 10/2002 Bock et al.
(Continued)

FOREIGN PATENT DOCUMENTS

EP 2581756 A1 4/2013
JP 6-014901 A 1/1994
(Continued)

OTHER PUBLICATIONS

International Search Report and Written Opinion for International Application No. PCT/US2015/038465, dated Oct. 7, 2015, 12 pages.

*Primary Examiner* — G. M. Hyder

(57) ABSTRACT

An apparatus and method for decoupling between a body coil and a surface coil. The method comprising a first acquiring step of acquiring magnetic resonance (MR) signals by concurrent reception by a body coil and a surface coil in a plurality of views; a second acquiring step of acquiring MR signals by independent reception by the body coil in some of the plurality of views; an identifying step of identifying a correspondence between the concurrently-received MR signal for the body coil, the concurrently-received MR signals for the surface coil, and the independently-received MR signal for the body coil based on the concurrently-received MR signals in the some views and the independently-received MR signals for the body coil; and a calculation step of determining the independently-received MR signals for the body coil in others of the plurality of views based on the correspondence and using the concurrently-received MR signals for the body coil and surface coil in the other views.

20 Claims, 6 Drawing Sheets

(51) Int. Cl.
  *G01R 33/36* (2006.01)
  *G01R 33/565* (2006.01)
  *G01R 33/58* (2006.01)
  *G01R 33/341* (2006.01)

(56) References Cited

U.S. PATENT DOCUMENTS

| | | |
|---|---|---|
| 2008/0297152 A1 | 12/2008 | Brau et al. |
| 2010/0189328 A1* | 7/2010 | Boernert .......... G01R 33/56375 382/131 |
| 2012/0019248 A1 | 1/2012 | Nonaka |
| 2015/0355297 A1* | 12/2015 | Menon ................ G01R 33/365 324/322 |
| 2017/0003367 A1* | 1/2017 | Chu ................ G01R 33/34076 |
| 2017/0212198 A1* | 7/2017 | Bekku ................ G01R 33/5659 |

FOREIGN PATENT DOCUMENTS

| | | |
|---|---|---|
| JP | 2003-070767 A | 3/2003 |
| WO | 03/005053 A1 | 1/2003 |
| WO | 2010107041 A1 | 9/2010 |

* cited by examiner

US 10,156,617 B2

MAGNETIC RESONANCE SIGNAL PROCESSING METHOD, MAGNETIC RESONANCE SIGNAL PROCESSING APPARATUS AND MAGNETIC RESONANCE APPARATUS, AND PROGRAM

CROSS-REFERENCE TO RELATED APPLICATIONS

This is a national stage application under 35 U.S.C. § 371(c) of PCT Application No. PCT/US2015/038465, filed on Jun. 30, 2015, which claims priority to Japanese Application No. 2014-133687, filed on Jun. 30, 2014, the disclosures of which are incorporated herein by reference in their entireties.

BACKGROUND

The present invention relates to a technique for processing magnetic resonance signals.

One known imaging technique using a magnetic resonance apparatus comprises performing reception of magnetic resonance signals by a body coil and reception of magnetic resonance signals by a surface coil, and reconstructing an image based on the magnetic resonance signals from both the body and surface coils.

According to the imaging technique, the magnetic resonance signals by the surface coil having the advantage in S/N (signal-to-noise) ratio are sensitivity-corrected based on the magnetic resonance signals by the body coil having the advantage in homogeneity of spatial sensitivity, for example, whereby an image can be obtained with high S/N ratio and at the same time without inequalities of sensitivity.

In recent years, there is proposed a variation of the imaging technique described above, that is, what we might call a concurrent reception technique, comprising concurrently receiving magnetic resonance signals by a body coil and a surface coil. Since the concurrent reception technique makes no temporal separation between reception by the body coil and that by the surface coil, there are provided advantages that the imaging time may be reduced and magnetic resonance signals by the coils may be received under the same environment. At that time, however, significant coupling usually occurs between the body coil and surface coil, which especially results in degradation of homogeneity of sensitivity in the body coil.

Accordingly, in performing the concurrent reception technique, hardware decoupling is generally applied, in which impedance of preamplifiers connected to the coils is brought close to zero, for example, to reduce such an effect.

However, there is a limit in hardware decoupling, thus often resulting in imperfect decoupling.

In view of such circumstances, there is a need for a technique in performing concurrent reception of magnetic resonance signals by a body coil and a surface coil using a magnetic resonance apparatus, with which decoupling between the coils can be effectively achieved.

SUMMARY

The invention in its first aspect provides a magnetic resonance signal processing method comprising a first acquiring step of acquiring magnetic resonance signals concurrently received by a body coil and a surface coil in a plurality of views; a second acquiring step of acquiring magnetic resonance signals independently received by said body coil in some of said plurality of views; an identifying step of identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring step and said independently-received magnetic resonance signals for said body coil in said some views acquired by said second acquiring step; and a calculation step of determining said independently-received magnetic resonance signals for said body coil in others of said plurality of views except said some views based on said correspondence and using said concurrently-received magnetic resonance signals for said body coil and surface coil in said other views.

The invention in its second aspect provides the magnetic resonance signal processing method in the first aspect, further comprising a correcting step of correcting said concurrently-received magnetic resonance signals for said surface coil based on said independently-received magnetic resonance signals for said body coil in said other views; and a reconstructing step of reconstructing an image based on said corrected magnetic resonance signals for said surface coil.

The invention in its third aspect provides the magnetic resonance signal processing method in the first or second aspect, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

The invention in its fourth aspect provides the magnetic resonance signal processing method in the third aspect, wherein said identifying step is a step of identifying coefficients by which said magnetic resonance signals for respective channels in said linear sum are to be multiplied.

The invention in its fifth aspect provides the magnetic resonance signal processing method in any one of the first through fourth aspects, wherein said some views are those included in a central portion of k-space in a phase encoding direction.

The invention in its sixth aspect provides the magnetic resonance signal processing method in the fifth aspect, wherein said some views are two or more views.

The invention in its seventh aspect provides the magnetic resonance signal processing method in any one of the first through sixth aspects, wherein a hardware decoupling is applied to said body coil and said surface coil.

The invention in its eighth aspect provides a magnetic resonance signal processing apparatus comprising a first acquiring portion configured for acquiring magnetic resonance signals concurrently received by a body coil and a surface coil in a plurality of views; a second acquiring portion configured for acquiring magnetic resonance signals independently received by said body coil in some of said plurality of views; an identifying portion configured for identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring portion and said independently-received magnetic resonance signals for said body coil in said some views acquired by said second acquiring portion; and a calculation portion configured for determining said independently-received magnetic resonance signals for said body coil in others of said plurality of views except said some views based on said correspondence and using said concurrently-received magnetic resonance signals for said body coil and surface coil in said other views.

The invention in its ninth aspect provides the magnetic resonance signal processing apparatus in the eighth aspect, further comprising a correcting portion configured for correcting said concurrently-received magnetic resonance signals for said surface coil based on said independently-received magnetic resonance signals for said body coil in said other views; and a reconstructing portion configured for reconstructing an image based on said corrected magnetic resonance signals for said surface coil.

The invention in its tenth aspect provides the magnetic resonance signal processing apparatus in the eighth or ninth aspect, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

The invention in its eleventh aspect provides the magnetic resonance signal processing apparatus in the tenth aspect, wherein said identifying portion is a portion for identifying coefficients by which said magnetic resonance signals for respective channels in said linear sum are to be multiplied.

The invention in its twelfth aspect provides the magnetic resonance signal processing apparatus in any one of the eighth through eleventh aspects, wherein said some views are those included in a central portion of k-space in a phase encoding direction.

The invention in its thirteenth aspect provides the magnetic resonance signal processing apparatus in the twelfth aspect, wherein said some views are two or more views.

The invention in its fourteenth aspect provides the magnetic resonance signal processing apparatus in any one of the eighth through thirteenth aspects, wherein a hardware decoupling is applied to said body coil and said surface coil.

The invention in its fifteenth aspect provides a magnetic resonance apparatus comprising a first receiving portion configured for concurrently receiving magnetic resonance signals by a body coil and a surface coil in a plurality of views; a second receiving portion configured for independently receiving magnetic resonance signals by said body coil in some of said plurality of views; an identifying portion configured for identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring portion and said independently-received magnetic resonance signals for said body coil in said some views acquired by said second acquiring portion; and a calculation portion configured for determining said independently-received magnetic resonance signals for said body coil in others of said plurality of views except said some views based on said correspondence and using said concurrently-received magnetic resonance signals for said body coil and surface coil in said other views.

The invention in its sixteenth aspect provides the magnetic resonance apparatus in the fifteenth aspect, further comprising a correcting portion configured for correcting said concurrently-received magnetic resonance signals for said surface coil based on said independently-received magnetic resonance signals for said body coil in said other views; and a reconstructing portion configured for reconstructing an image based on said corrected magnetic resonance signals for said surface coil.

The invention in its seventeenth aspect provides the magnetic resonance apparatus in the fifteenth or sixteenth aspect, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

The invention in its eighteenth aspect provides the magnetic resonance apparatus in the seventeenth aspect, wherein said identifying portion identifies coefficients by which said magnetic resonance signals for respective channels in said linear sum are to be multiplied.

The invention in its nineteenth aspect provides the magnetic resonance apparatus in any one of the fifteenth through eighteenth aspects, wherein said some views are those included in a central portion of k-space in a phase encoding direction.

The invention in its twentieth aspect provides the magnetic resonance apparatus in any one of the fifteenth through nineteenth aspect, wherein said some views are two or more views.

The invention in its twenty-first aspect provides the magnetic resonance apparatus in any one of the fifteenth through twentieth aspect, wherein a hardware decoupling is applied to said body coil and said surface coil.

The invention in its twenty-second aspect provides a program for causing a computer to function as the magnetic resonance signal processing apparatus in any one of the eighth through fourteenth aspects.

According to the invention in the aspects described above, a body coil section and a surface coil section can be decoupled by means of software, so that decoupling may be achieved more efficiently beyond the limits of hardware decoupling.

DETAILED DESCRIPTION

One embodiment of the present invention is a magnetic resonance imaging apparatus (magnetic resonance imaging system) for performing decoupling between a body coil and a surface coil by means of software.

Figure 1:
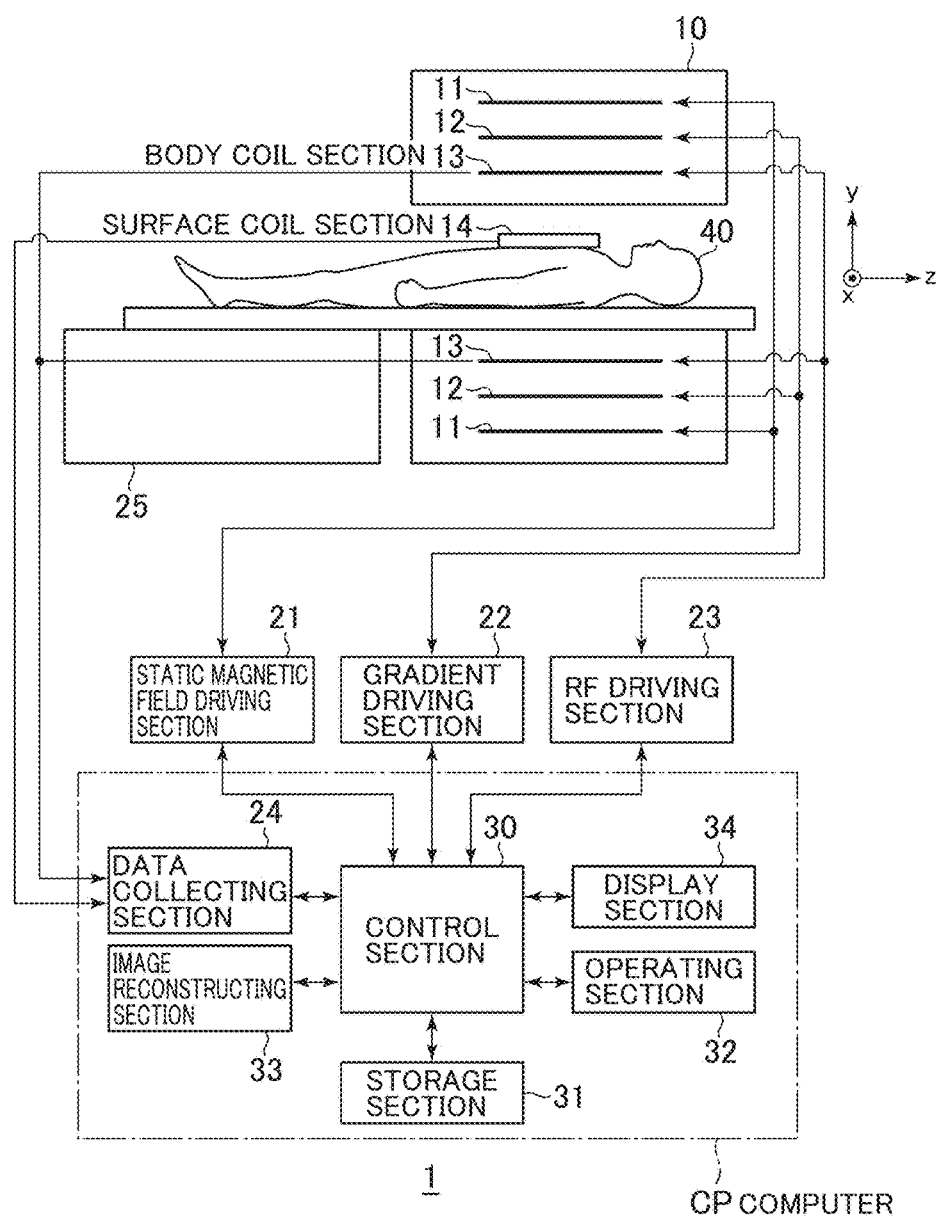
FIG. 1 is a diagram schematically showing a configuration of a magnetic resonance imaging apparatus in accordance with an embodiment of the present invention.

FIG. 1 is a diagram schematically showing a configuration of a magnetic resonance imaging apparatus in accordance with the present embodiment.

As shown in FIG. 1, the magnetic resonance imaging apparatus 1 comprises a static magnetic field coil section 11, a gradient coil section 12, a body coil section 13, a surface coil section 14, a static magnetic field driving section 21, a gradient driving section 22, an RF driving section 23, a data collecting section 24, a subject carrying section 25, a control section 30, a storage section 31, an operating section 32, an image reconstructing section 33, and a display section 34.

The static magnetic field coil section 11 is a superconductive coil, for example, for receiving supply of electric current, and generating a static magnetic field to create a static magnetic field space.

The gradient coil section 12 receives supply of electric current, and generates gradient magnetic fields independently in three axis directions: a slice axis direction, a phase encoding direction, and a frequency encoding direction. It should be noted that the frequency encoding direction, phase encoding direction, and slice axis direction here correspond to an x-direction, a y-direction, and a z-direction, respectively, shown in FIG. 1.

The body coil section 13 receives supply of electric current, and generates a high-frequency magnetic field i.e., RF (radio frequency) pulses for exciting atomic nuclear spins in a subject 40 in the static magnetic field space. The body coil section 13 also receives magnetic resonance signals (referred to as MR signals hereinbelow) from the subject 40.

The surface coil section 14 is placed on a surface of a region to be imaged in the subject 40, and it receives MR signals from the region to be imaged. The surface coil section 14 is comprised of a plurality of channel coils. The number of channel coils, i.e., the number of channels, is of the order of 2-10, for example. The channel coil is sometimes referred to as coil element.

The static magnetic field driving section 21 drives the static magnetic field coil section 11 based on a control signal from the control section 30 to generate a static magnetic field.

The gradient driving section 22 drives the gradient coil section 12 based on a control signal from the control section 30 to generate a gradient magnetic field in the static magnetic field space.

The RF driving section 23 drives the body coil section 13 based on a control signal from the control section 30 to generate a high frequency magnetic field in the static magnetic field space.

The data collecting section 24 applies phase detection to MR signals received by the body coil section 13 and surface coil section 14, and A-D (Analog-to-Digital) converts the resulting signals to generate MR signal data. The generated MR signal data is output to the storage section 31.

The subject carrying section 25 carries the subject 40 into/out of the static magnetic field space based on a control signal from the control section 30.

The control section 30 sends a control signal to the gradient driving section 23 for controlling it to perform gradient shimming for each subject 40 or for each region to be imaged. The control section 30 also sends control signals to the static magnetic field driving section 21, gradient driving section 22, RF driving section 23, data collecting section 24, and subject carrying section 25 for controlling them to perform a specified pulse sequence based on an operation signal from the operating section 32.

The storage section 31 stores therein the MR signal data collected by the data collecting section 24, image data obtained by applying image reconstruction processing by the image reconstructing section 33, and the like.

The image reconstructing section 33 reads the MR signal data from the storage section 31 by control from the control section 30, and applies image reconstruction processing to the MR signal data to create image data. The image data is output to the storage section 31.

The display section 34 displays information required in operation of the operating section 32, an image represented by the image data, and the like.

It should be noted that the data collecting section 24, control section 30, storage section 31, operating section 32, image reconstructing section 33, and display section 34 are constructed by a computer CP, for example.

Moreover, a hardware decoupling is applied to the body coil section 13 and surface coil section 14. For example, the impedance of preamplifiers (not shown) connected to the respective coils in the data collecting section 24 is designed to be as low as possible. However, the hardware decoupling is not perfect and significant coupling is still present.

Figure 2:
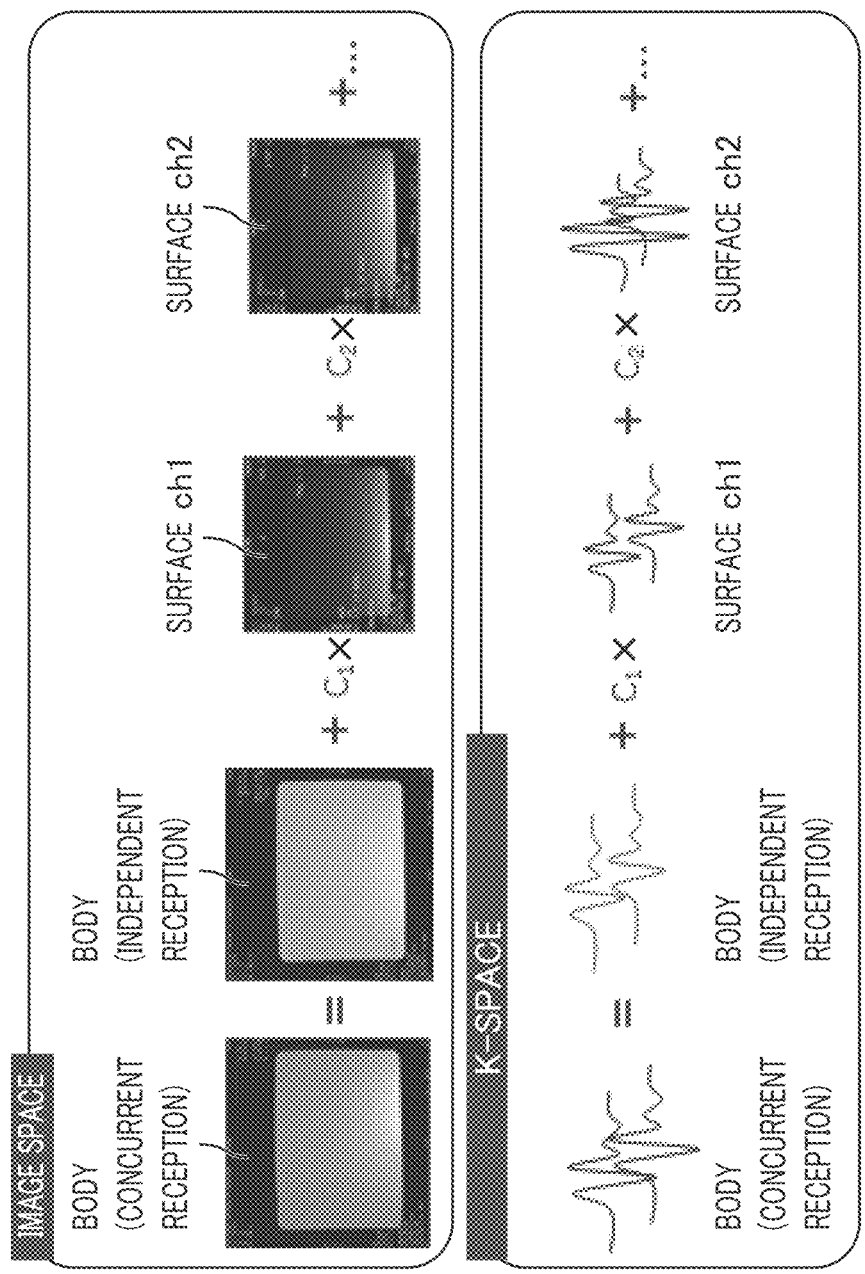
FIG. 2 is a diagram for explaining the concept of decoupling in the present embodiment.

Now a method of software decoupling in the present embodiment will be described. FIG. 2 is a diagram for explaining the concept of decoupling in the present embodiment.

First consider a simple model: it may be assumed that an effect of coupling between the body coil section 13 and surface coil section 14 on MR signals at the body coil section 13 is expressed by a linear sum of images based on MR signal data for respective channel coils in the surface coil section 14, as shown in the upper portion of FIG. 2. Since the linear sum relationship in an image space is kept in k-space as well, it may be contemplated that a similar relationship holds also in k-space, as shown in the lower portion of FIG. 2. When such linearity holds, an equation of a linear sum holds at each point in k-space. There are a number n of unknown combination coefficients $c_1, c_2, \ldots, c_n$ in the linear sum, which number n is equal to the number of channel coils in the surface coil section 14, while there may be present a number, which may be equal to the number of points in k-space, of equations. Therefore, the unknown combination coefficients $c_1, c_2, \ldots, c_n$ may be determined for respective channel coils by determining terms other than the combination coefficients, i.e., MR signal data, by an actual scan in some of such a large number of equations that may be present, and solving these some equations by, for example, a least squares method. By determining the combination coefficients, MR signal data by independent reception for the body coil section 13 may be determined from MR signal data obtained by concurrent reception for the body coil section 13 and surface coil section 14. That is, software decoupling is thus achieved.

Taking the concept as described above into account, in this embodiment, MR signal data is first acquired by concurrent reception by the body coil section 13 and surface coil section 14 in a plurality of views filling the main portion of k-space. Additionally, MR signal data is acquired by independent reception by the body coil section 13 in some of the plurality of views in k-space. The data may be acquired by switching between the coils for use in reception during a main scan, or acquired beforehand prior to the main scan. Then, the equation as described above is formulated for each point in the some views in k-space, and the equations are solved to determine the coefficients. Once the coefficients have been determined, MR signal data by independent reception by the body coil section 13, which data is unaffected by coupling with the surface coil section 14, is determined in other remaining ones of the plurality of views except the some views, from the MR signal data obtained by concurrent reception by the body coil section 13 and surface coil section 14.

Figure 3:
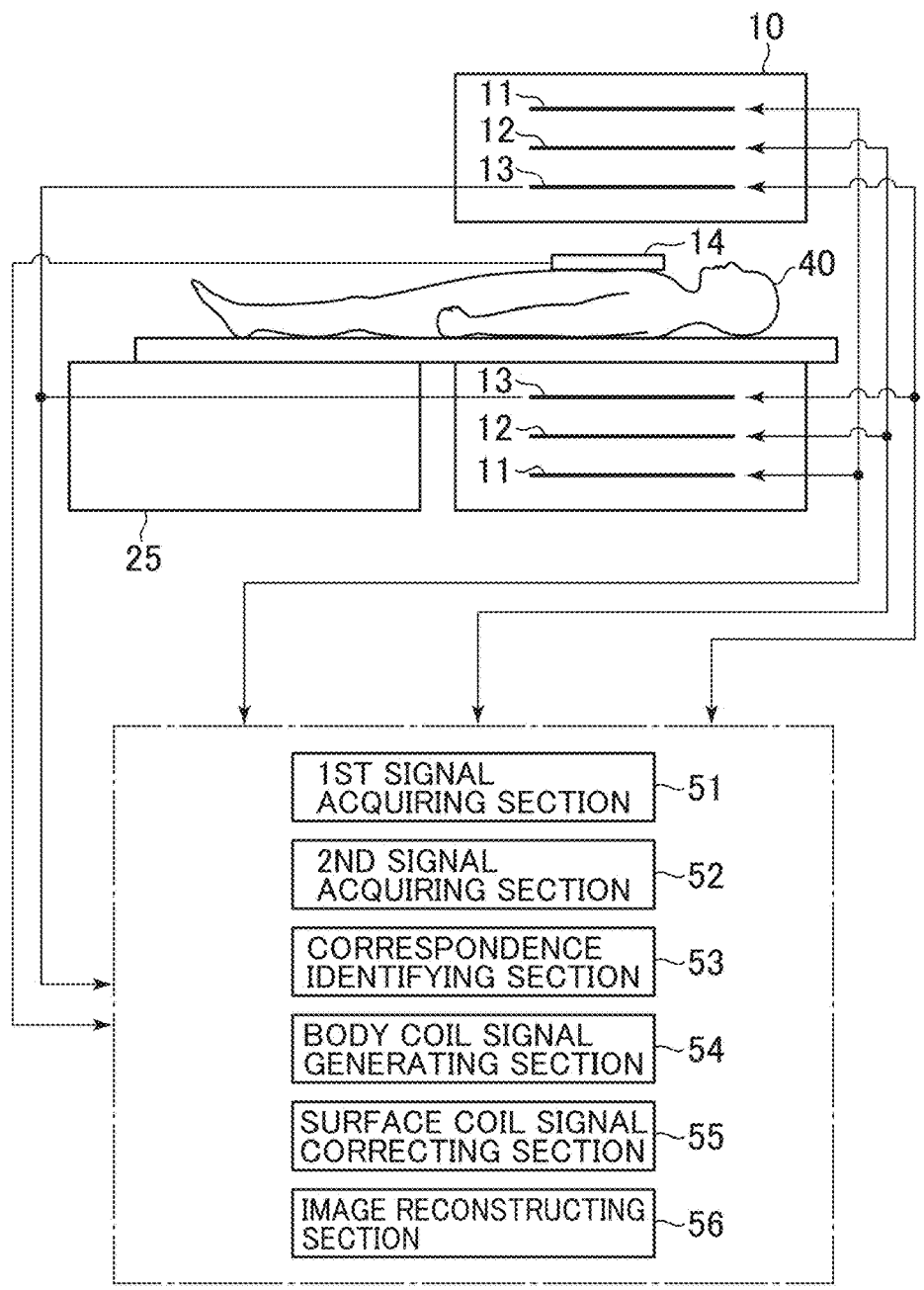
FIG. 3 is a functional block diagram functionally representing the magnetic resonance imaging apparatus.

FIG. 3 is a functional block diagram functionally representing the magnetic resonance imaging apparatus 1 in accordance with the present embodiment. The magnetic resonance imaging apparatus 1 comprises a first signal acquiring section 51, a second signal acquiring section 52, a correspondence identifying section 53, a body coil signal generating section 54, a surface coil signal correcting section 55, and an image reconstructing section 56. It should be noted that these sections 51-56 are implemented by, for example, causing a computer to execute specified programs. Moreover, these sections 51-56 represent exemplary embodiments of the first acquiring portion, the second acquiring portion, the identifying portion, the calculating portion, the correcting portion, and the reconstructing portion, respectively, in the present invention.

The first signal acquiring section 51 acquires MR signals by concurrent reception from the body coil section 13 and surface coil section 14 in a plurality of views spreading in the phase encoding direction in k-space.

The second signal acquiring section 52 acquires MR signals by independent reception from the body coil section 13 in some of the plurality of views.

The correspondence identifying section 53 identifies, based on the acquired MR signals, a correspondence between the MR signal for the body coil section 13 by concurrent reception, MR signals for the surface coil section 14 by concurrent reception, and MR signal for the body coil section 13 by independent reception.

The body coil signal generating section 54 generates, based on the identified correspondence, MR signals for the body coil section 13 by independent reception in remaining ones of the plurality of views except the some views in k-space using the acquired MR signals.

The surface coil signal correcting section 55 applies sensitivity correction to the MR signals for the surface coil section 14 by concurrent reception based on the resulting MR signals for the body coil section 13 by independent reception in the plurality of views.

The image reconstructing section 56 reconstructs an image based on the sensitivity-corrected MR signals for the surface coil section 14.

Now flow of imaging processing in the magnetic resonance imaging apparatus 1 in accordance with the present embodiment will be described.

Figure 4:
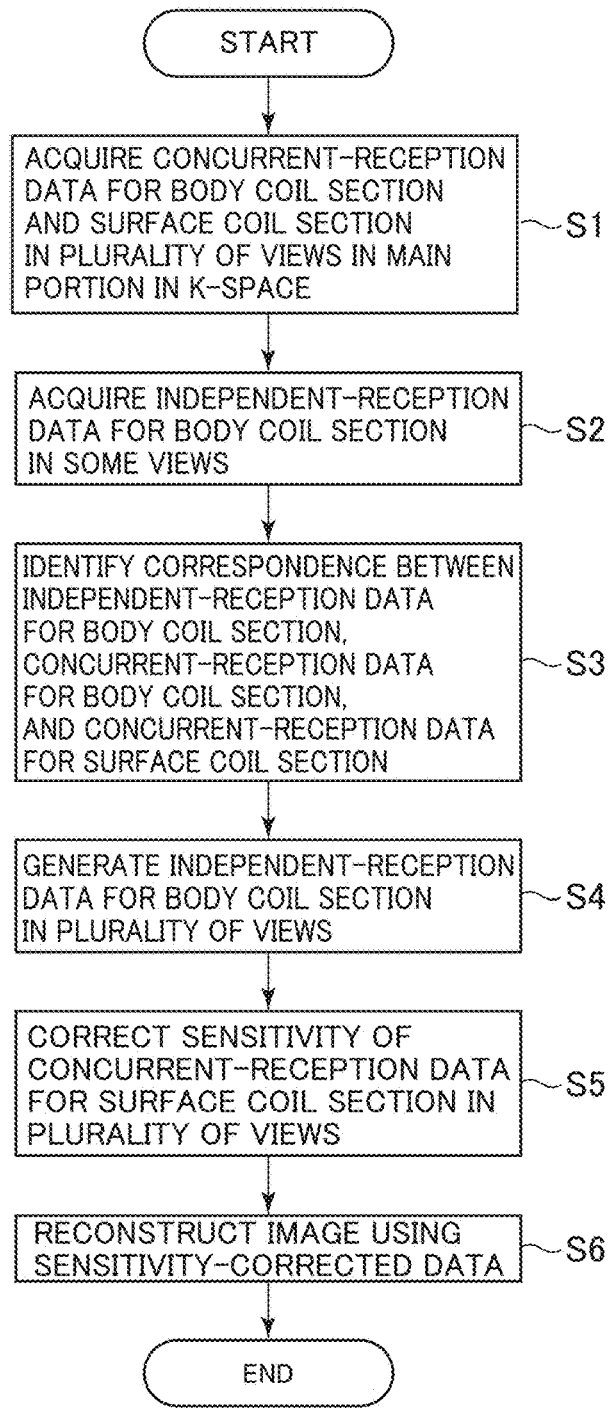
FIG. 4 is a flow chart of imaging processing in the magnetic resonance imaging apparatus.
Figure 5:
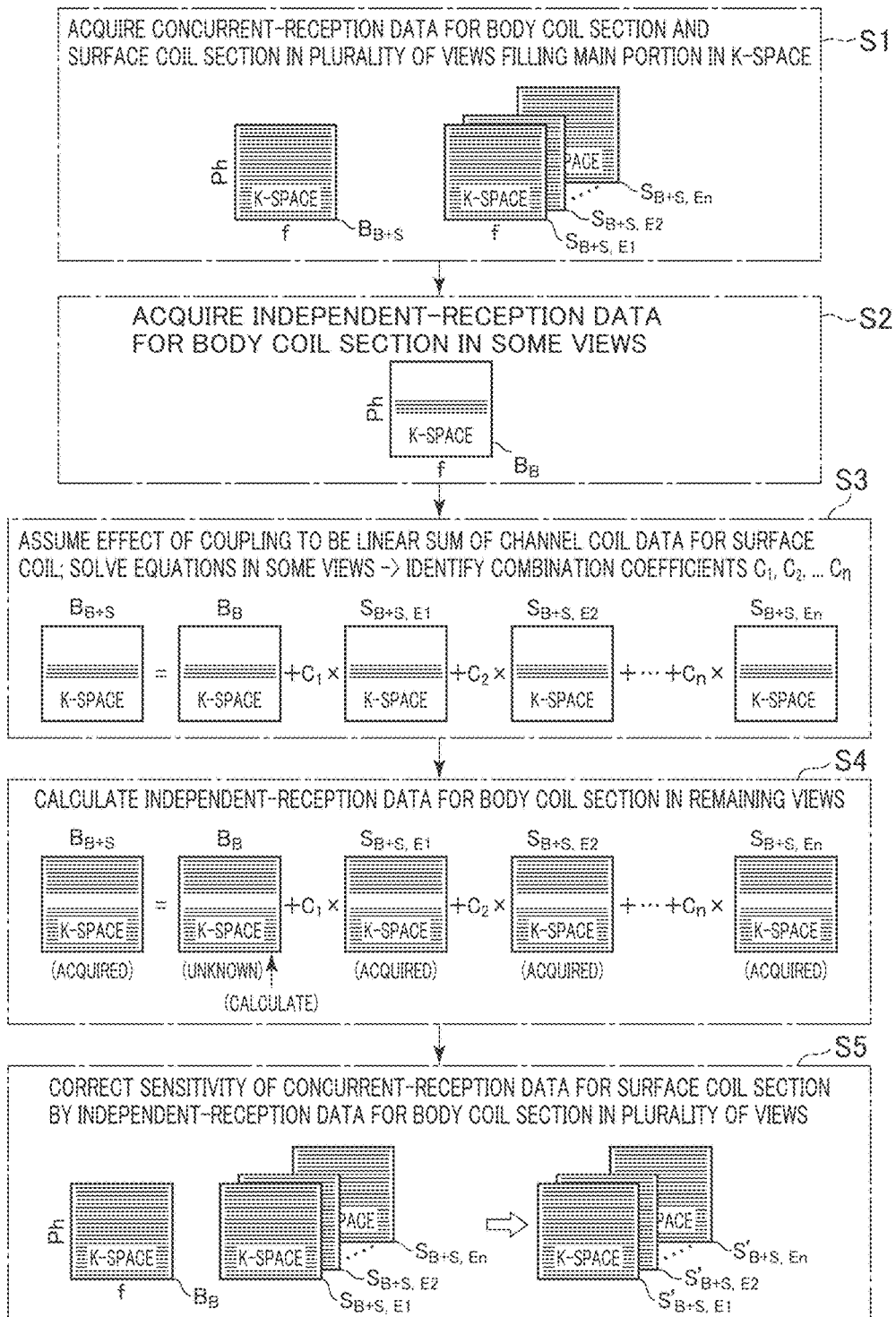
FIG. 5 is a diagram conceptually representing the imaging processing in the magnetic resonance imaging apparatus.

FIG. 4 is a flow chart of imaging processing in the magnetic resonance imaging apparatus 1. FIG. 5 is a diagram conceptually representing the imaging processing. It is assumed here for convenience that a region in one predefined slice in the subject 40 is imaged and an image in the slice is reconstructed.

At Step S1, the operator places the surface coil section 14 on the subject 40. Then, as shown in FIG. 5, the first signal acquiring section 51 performs, in response to a command by the operator, a scan on a predefined slice region SR in a plurality of views so that a main portion in k-space is almost completely filled, and concurrently receives MR signals by the body coil section 13 and surface coil section 14 from the slice region SR in each view. In terms of a pulse sequence, a scan is performed while changing the intensity of the phase encoding pulse to each of a plurality of levels, and MR signals are concurrently received by the two coils in each of the scans.

This gives MR signals $B_{B+S,V-m}, \ldots, B_{B+S,V+m}$ for the body coil section 13 by concurrent reception by the body coil section 13 and surface coil section 14 in a plurality of views V−m-V+m, and MR signals $S_{B+S,V-m,E1}$-$S_{B+S,V-m,En}, \ldots, S_{B+S,V+m,E1}$-$S_{B+S,V+m,En}$ for the channel coils E1-En in the surface coil section 14 by concurrent reception by the body coil section 13 and surface coil section 14 in the plurality of views V−m-V+m.

At Step S2, the operator electrically detaches the surface coil section 14 or takes it away from the subject 40 to eliminate coupling between the body coil section 13 and surface coil section 14. Then, as shown in FIG. 5, the second signal acquiring section 52 performs a scan on the slice region SR in some Vk-Vk+a of the plurality of views in response to a command by the operator, and independently receives MR signals by the body coil section 13 alone from the slice region SR in the some views. In terms of a pulse sequence, a scan is performed while limiting the intensity of the phase encoding pulse to one of the plurality of levels or some, such as two or more, of the levels, and MR signals are received solely by the body coil section 13 in each of the scans. No reception is performed by the surface coil section 14.

This gives MR signal $B_{B,Vk}, B_{B,Vk+1}, \ldots, B_{B,Vk+a}$ for the body coil section 13 by independent reception by the body coil section 13 in the some views Vk, Vk+1, ..., Vk+a.

The some views are desirably those included in a central portion of k-space in the phase encoding direction. While the number of the some views may be one, it is desirably two or more. In these cases, since MR signals for the body coil 24 by independent reception by the body coil 24 in the some views contains a lot of information on the subject 40, accuracy in identification of a "correspondence between MR signals," which will be discussed later, is improved. However, too large a number of the some views increases the scan time at Step S2, and therefore, a suitable number is four or less, for example. Moreover, Step S2 may be performed beforehand prior to execution of Step S1. At Step S3, as shown in FIG. 5, the correspondence identifying section 53 identifies a correspondence between the MR signal for the body coil section 13 by concurrent reception, MR signals for the surface coil section 14 by concurrent reception, and MR signal for the body coil section 13 by independent reception, based on the MR signals $B_{B+S,Vk}, B_{B+S,Vk+1}, \ldots, B_{B+S,Vk+a}$ for the body coil section 13 by concurrent reception in the some views Vk, Vk+1, ..., Vk+a, MR signals $S_{B+S,vk,E1}$-$S_{B+S,Vk,En}, S_{B+S,+Vk+1,E1}$-$S_{B+S,+Vk+1,En}, \ldots, S_{B+S,+Vk+a,E1}$-$S_{B+S,+Vk+a,En}$ for the channel coils E1-En in the surface coil section 14 by concurrent reception in the some views Vk, Vk+1, Vk+a, and MR signals $B_{B,Vk}, B_{B,Vk+1}, \ldots, B_{B,Vk+a}$ for the body coil section 13 by independent reception in the some views Vk, Vk+1, ..., Vk+a.

Specifically, assume that an MR signal $B_{B+S,Vi}$ for the body coil section 13 by concurrent reception can be expressed by a linear sum of an MR signal $B_{B,vi}$ for the body coil section 13 by independent reception, and MR signals $S_{B+S,Vi,E1}, S_{B+S,Vi,E2}, \ldots, S_{B+S,Vi,En}$ for the channel coils in the surface coil section 14 by concurrent reception at the same point in the same view Vi in k-space, as given by the equation below. The coefficients $c_1, c_2, c_n$ are each constant regardless of the view. By identifying the coefficients $c_1, c_2, c_n$, the correspondence is identified.

$$B_{B+S,Vi} = B_{B,Vi} + c_1 \cdot S_{B+S,Vi,E1} + c_2 \cdot S_{B+S,Vi,E2} + \ldots c_n \cdot S_{B+S,Vi,En} \quad (1)$$

That is, the coefficients $c_1, c_2, c_n$ are identified by substituting an equation in which the view Vi in Equation (1) is each of the some views Vk, Vk+1, Vk+a with the acquired MR signals, and solving the equation.

At Step S4, as shown in FIG. 5, the body coil signal generating section 54 determines signals equivalent to MR signals for the body coil 24 by independent reception in remaining ones of the plurality of views V−m-V+m except the some views Vk-Vk+a, by substituting Equation (1) in which the coefficients $c_1$, $c_2$, $c_n$ are identified with the acquired MR signals and solving the equation. Thus, MR signals for the body coil 24 by independent reception can be obtained in all the plurality of views.

At Step S5, as shown in FIG. 5, the surface coil signal correcting section 55 applies sensitivity correction to the MR signals for the surface coil section 14 by concurrent reception in the plurality of views, based on the MR signals for the body coil by independent reception in the plurality of views.

At Step S6, the image reconstructing section 56 reconstructs an image based on the sensitivity-corrected MR signals for the surface coil by concurrent reception in the plurality of views. That is, Fourier transform is applied to the MR signals to reconstruct an MR image in the slice region SR.

Now an exemplary result of decoupling between the body coil and surface coil by the technique of the present embodiment will be demonstrated.

Figure 6:
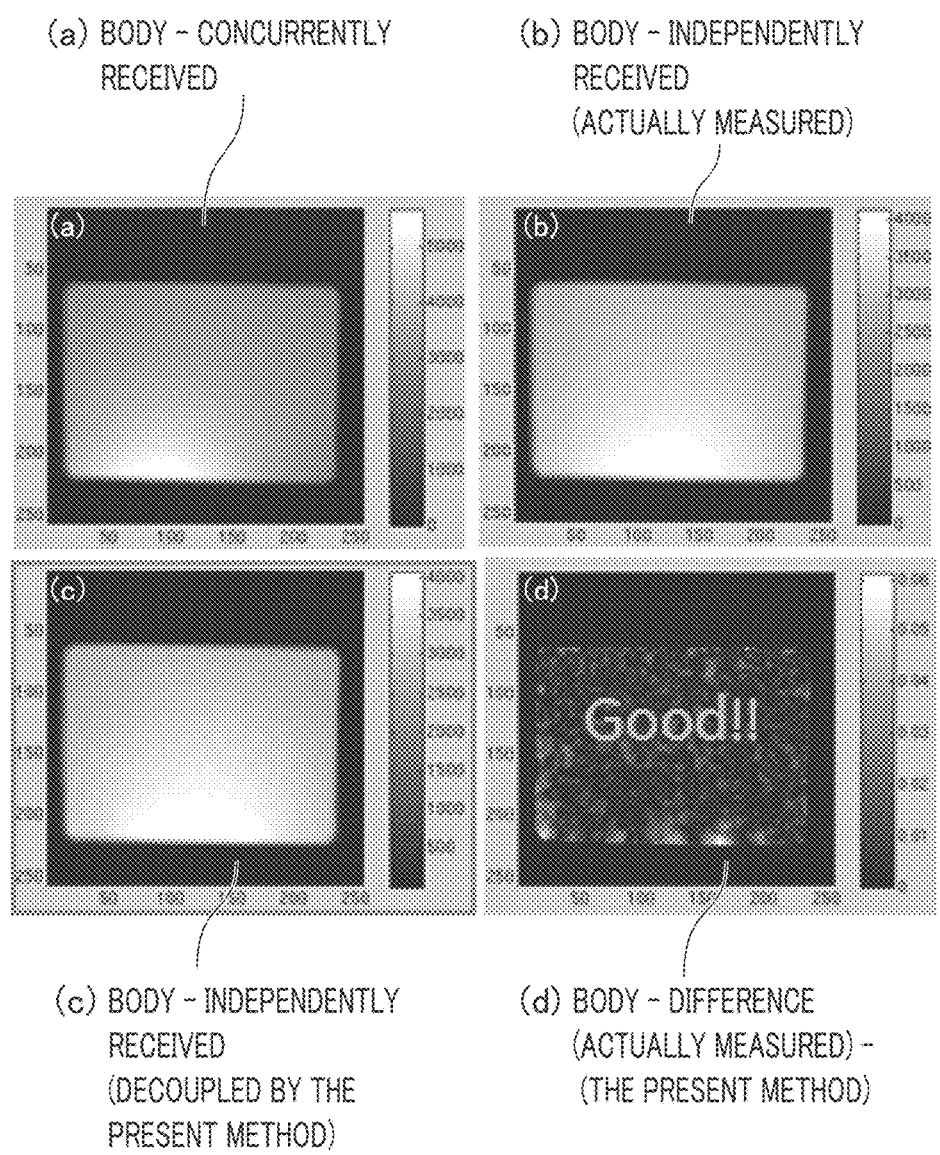
FIG. 6 shows images demonstrating a result of decoupling by the technique of the present embodiment.

FIG. 6 shows images demonstrating a result of decoupling by the technique of the present embodiment. FIGS. 6(a)-(c) show images obtained by imaging the air as subject. FIG. 6(a) is an image reconstructed based on MR signals for the body coil by concurrent reception by the body coil and surface coil. FIG. 6(b) is an image reconstructed based on MR signals actually measured by independent reception by the body coil. The image by independent reception has generally uniform brightness. On the other hand, the image by concurrent reception has a region in the lower left portion in which the brightness is slightly higher, suggesting that coupling with the surface coil occurs. FIG. 6(c) is an image reconstructed based on MR signals for the body coil obtained by applying decoupling according to the technique proposed herein. The image has generally uniform brightness, which proves the effect of decoupling. FIG. 6(d) is a differential image between the image by independent reception by the body coil (actually measured) and the image to which decoupling is applied. This image has a small amount of error component, which proves that decoupling is achieved with high accuracy.

As described above, according to the present embodiment, the body coil section 13 and surface coil section 14 can be decoupled by means of software, so that decoupling may be achieved more efficiently beyond the limits of hardware decoupling.

The present invention is not limited to the embodiment above, and several modifications may be made without departing from the spirit and scope of the invention.

For example, the embodiment above assumes that concurrent reception of MR signals by the body coil section 13 and surface coil section 14 is performed in a main scan; however, it may be assumed that the concurrent reception is performed in a calibration scan prior to the main scan. In this case, again, software decoupling may be achieved by a similar technique.

Moreover, for example, a correspondence between MR signals is expressed by using a linear sum of MR signals from a plurality of channel coils constituting the surface coil section 14 in the embodiment above; however, the correspondence may be expressed by a non-linear sum.

Further, for example, in identifying the coefficients $c_1$, $c_2$, $c_n$ by which MR signals in the channel coils are to be multiplied, the number of equations may be increased by replacing Equation (1) by Equation (2) using MR signals in adjacent views as well for approximation to improve accuracy in identification of coefficients.

$$B_{B+S,Vi} = B_{B,Vi} + c_1 \cdot S_{B+S,Vi,E1} + c_2 \cdot S_{B+S,Vi,E2} + \ldots + c_n \cdot S_{B+S,Vi,En} \tag{1}$$

$$B_{B+S,Vi} = B_{B,Vi} + c_1 \cdot S_{B+S,Vi\pm 1,E1} + c_2 \cdot S_{B+S,Vi\pm 1,E2} + \ldots + c_n S_{B+S,Vi\pm 1,En} \tag{2}$$

Furthermore, for example, hardware measures for decoupling are applied to the body coil section 13 and surface coil section 14 in this embodiment; however, the present invention may be applied to a case in which no such hardware measures for decoupling are applied.

While the embodiment above refers to a magnetic resonance imaging apparatus, an MR signal processing apparatus that conducts the processing on MR signals as described above, a program for causing a computer to function as such an MR signal processing apparatus, and a computer-readable recording medium on which the program is recorded also each constitute one embodiment of the present invention. The recording media include non-transitory media such as a CD-ROM, a USB memory, and a server in a network.

I claim:

1. A magnetic resonance signal processing method comprising:
   a first acquiring step of acquiring magnetic resonance signals concurrently received by a body coil and a surface coil in a plurality of views;
   a second acquiring step of acquiring magnetic resonance signals independently received by said body coil in some of said plurality of views;
   an identifying step of identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring step and said independently-received magnetic resonance signals for said body coil in said some views acquired by said second acquiring step; and
   a calculation step of determining said independently-received magnetic resonance signals for said body coil in others of said plurality of views except said some views based on said correspondence and using said concurrently-received magnetic resonance signals for said body coil and surface coil in said other views.

2. The magnetic resonance signal processing method as recited in claim 1, further comprising:
   a correcting step of correcting said concurrently-received magnetic resonance signals for said surface coil based on said independently-received magnetic resonance signals for said body coil in said other views; and
   a reconstructing step of reconstructing an image based on said corrected magnetic resonance signals for said surface coil.

3. The magnetic resonance signal processing method as recited in claim 1, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

4. The magnetic resonance signal processing method as recited in claim 3, wherein said identifying step is a step of identifying coefficients by which said magnetic resonance signals for respective channels in said linear sum are to be multiplied.

5. The magnetic resonance signal processing method as recited in claim 1, wherein, said some views are those included in a central portion of k-space in a phase encoding direction.

6. The magnetic resonance signal processing method as recited in claim 5, wherein said some views are two or more views.

7. The magnetic resonance signal processing method as recited in claim 1, wherein a hardware decoupling is applied to said body coil and said surface coil.

8. A magnetic resonance signal processing apparatus comprising:
a first acquiring portion configured for acquiring magnetic resonance signals concurrently received by a body coil and a surface coil in a plurality of views;
a second acquiring portion configured for acquiring magnetic resonance signals independently received by said body coil in some of said plurality of views;
an identifying portion configured for identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring portion and said independently-received magnetic resonance signals for said body coil in said some views acquired by said second acquiring portion; and
a calculation portion configured for determining said independently-received magnetic resonance signals for said body coil in others of said plurality of views except said some views based on said correspondence and using said concurrently-received magnetic resonance signals for said body coil and surface coil in said other views.

9. The magnetic resonance signal processing apparatus as recited in claim 8, further comprising:
a correcting portion configured for correcting said concurrently-received magnetic resonance signals for said surface coil based on said independently-received magnetic resonance signals for said body coil in said other views; and
a reconstructing portion configured for reconstructing an image based on said corrected magnetic resonance signals for said surface coil.

10. The magnetic resonance signal processing apparatus as recited in claim 8, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

11. The magnetic resonance signal processing apparatus as recited in claim 10, wherein said identifying portion is a portion configured for identifying coefficients by which said magnetic resonance signals for respective channels in said linear sum are to be multiplied.

12. The magnetic resonance signal processing apparatus as recited in claim 8, wherein said some views are those included in a central portion of k-space in a phase encoding direction.

13. The magnetic resonance signal processing apparatus as recited in claim 12, wherein said some views are two or more views.

14. The magnetic resonance signal processing apparatus as recited in claim 8, wherein a hardware decoupling is applied to said body coil and said surface coil.

15. A magnetic resonance apparatus comprising:
a first receiving portion configured for concurrently receiving magnetic resonance signals by a body coil and a surface coil in a plurality of views;
a second receiving portion configured for independently receiving magnetic resonance signals by said body coil in some of said plurality of views;
an identifying portion configured for identifying a correspondence between said concurrently-received magnetic resonance signal for said body coil, said concurrently-received magnetic resonance signals for said surface coil, and said independently-received magnetic resonance signal for said body coil based on said concurrently-received magnetic resonance signals in said some views acquired by said first acquiring portion and said independently-received magnetic resonance signals for said body coil in said some views acquired by said second acquiring portion; and
a calculation portion configured for determining said independently-received magnetic resonance signals for said body coil in others of said plurality of views except said some views based on said correspondence and using said concurrently-received magnetic resonance signals for said body coil and surface coil in said other views.

16. The magnetic resonance apparatus as recited in claim 15, further comprising:
a correcting portion configured for correcting said concurrently-received magnetic resonance signals for said surface coil based on said independently-received magnetic resonance signals for said body coil in said other views; and
a reconstructing portion configured for reconstructing an image based on said corrected magnetic resonance signals for said surface coil.

17. The magnetic resonance apparatus as recited in claim 15, wherein said correspondence is a relationship such that said concurrently-received magnetic resonance signal for said body coil is expressed by a linear sum of said independently-received magnetic resonance signal for said body coil and said concurrently-received magnetic resonance signals for respective channels in said surface coil.

18. The magnetic resonance apparatus as recited in claim 17, wherein said identifying portion identifies coefficients by which said magnetic resonance signals for respective channels in said linear sum are to be multiplied.

19. The magnetic resonance apparatus as recited in claim 15, wherein said some views are those included in a central portion of k-space in a phase encoding direction.

20. The magnetic resonance apparatus as recited in claim 15, wherein a hardware decoupling is applied to said body coil and said surface coil.

* * * * *